(12) United States Patent
Shah

(10) Patent No.: US 6,472,686 B1
(45) Date of Patent: Oct. 29, 2002

(54) SILICON CARBIDE (SIC) GATE TURN-OFF (GTO) THYRISTOR APPARATUS AND METHOD FOR HIGH POWER CONTROL

(75) Inventor: Pankaj B. Shah, Silver Spring, MD (US)

(73) Assignee: United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/677,650

(22) Filed: Oct. 3, 2000

(51) Int. Cl.[7] ................. H01L 31/0312; H01L 29/74
(52) U.S. Cl. ................ 257/77; 257/146; 257/137; 257/138
(58) Field of Search ............ 257/77, 107, 133–138, 257/140, 143, 146, 147, 115, 119, 121, 124; 438/186; 361/31, 91

(56) References Cited

U.S. PATENT DOCUMENTS

| | | | |
|---|---|---|---|
| 5,212,619 A | * 5/1993 | Baudelot et al. | 361/91 |
| 5,245,495 A | * 9/1993 | Bailey et al. | 361/23 |
| 5,614,737 A | * 3/1997 | Piccone | 257/124 |
| 5,831,289 A | * 11/1998 | Agarwal | 257/77 |

FOREIGN PATENT DOCUMENTS

DE 4217234 * 5/1992 .......... H02H/7/122

OTHER PUBLICATIONS

"4H–SiC Turn–Off Thyristor Designs for Very High Power Control," P.B. Shah, B.R. Geil, K.A. Jones, T.E. Griffin & M.A. Derenge, Proceedings of the International Conference on Silicon Carbide and Related Materials, Oct. 10–15 199.

* cited by examiner

Primary Examiner—Tom Thomas
Assistant Examiner—Ori Nadav
(74) Attorney, Agent, or Firm—Paul S. Clohan, Jr.; Edward L. Stolarun

(57) ABSTRACT

A Silicon Carbide (SiC) Gate Turn-Off (GTO) thyristor is formed of a substrate having at least three epi-layers provided thereon as first, second and third doped regions, respectively, and the substrate being a fourth doped region, wherein the at least four doped regions alternate between a p-type doping and an n-type doping, with the regions being at least partially overlaid. An anode is arranged on the first region, and a base is arranged on the second region. A controlling gate is arranged on the third region, and a cathode is arranged on the fourth region. A current divider divides the load current between the anode and the base. This reduces the voltage drop of a portion of the load current passing through the thyristor, allowing for the switching of higher current densities than in prior art thyristors, faster switching speeds and reduced junction temperatures.

11 Claims, 6 Drawing Sheets

SILICON CARBIDE (SIC) GATE TURN-OFF (GTO) THYRISTOR APPARATUS AND METHOD FOR HIGH POWER CONTROL

BACKGROUND OF THE INVENTION

1. Field of the Invention

The present invention relates to Gate Turn-Off (GTO) thyristor switches, and more particularly, to high power, high temperature Silicon Carbide (SiC) GTO thyristor switches.

2. Description of the Related Art

Thyristors are devices used for switching AC or DC power, and are used in high power conditioning circuits, high voltage systems, and traction circuits. Thyristors have a p/n/p/n junction sequence and three terminals (an anode, a cathode, and a gate). Upon application of a current pulse to the gate terminal, a forward current condition is established between the anode and the cathode.

In a standard thyristor, the gate loses control to turn off the device once the current is initially pulsed to the gate to turn on the forward conduction between the anode and cathode. A reverse bias voltage must be placed across the anode-tocathode path in order to turn off the device.

However, in a GTO thyristor, the forward conduction between the anode and the cathode is cut off by merely reversing the gate bias, without having to reduce the main current below a certain threshold level. This feature distinguishes GTO thyristors from other types of switching devices, such as a silicon-controlled rectifier. GTO thyristors normally begin conduction by receiving a trigger input and function as diodes thereafter.

SiC GTO thyristors are an improvement over Silicon GTO thyristors because they switch faster, handle higher power and can function at higher temperature. U.S. Pat. No. 5,539,217 (to Edmond, et al.) and U.S. Pat. No. 5,831,289 (to Agarwal) disclose additional information regarding SiC thyristors, and the contents of these patents are hereby incorporated by reference in their entireties.

The voltage drop between the anode and the cathode in prior art SiC GTO thyristors (such as those disclosed in the above-referenced patents) is about 3V, which is typical for high power thyristor devices. This voltage drop results in a switching power loss, which becomes a dominating factor affecting the device junction temperature at high operating frequencies. As the rated voltage of a thyristor increases, the thickness of a drift region formed adjacent to the anode or cathode (and having opposite conductivity to the anode or cathode) increases dramatically, as does its resistance.

SUMMARY OF THE INVENTION

Accordingly, it is an object of the present invention to develop a SiC GTO thyristor which has improved efficiency for use in high power applications.

To this end, according to the present invention, there is provided a Silicon Carbide (SiC) Gate Turn-Off (GTO) thyristor and method for providing such thyristor having at least four doped regions which alternate between a p-type doping and an n-type doping, with the regions being at least partially overlaid. The first, second and third doped regions are epi-layers with the substratum or substrate comprising the fourth region. An anode is arranged on the first region, and a base is arranged on the second region. A controlling gate is arranged on the third region, and a cathode is arranged on the fourth region. A current divider divides the load current between the anode and the base. This current division reduces the voltage drop of a portion of the load current passing through the thyristor, allowing for the switching of higher current densities than in prior art thyristors, faster switching speeds and reduced junction temperatures.

More particularly, the present invention provides a Silicon Carbide (SiC) Gate Turn-Off (GTO) thyristor structure comprising: a substrate formed of SiC having at least three epilayer arranged thereon as first, second and third planar doped regions, respectively, said substrate comprising a fourth doped region, and each of said first, second, third and fourth doped regions having a first side and a second side opposite to the first side, the first, second, third and fourth doped regions being disposed in a sequential arrangement to at least partially overlap one another to form a stack with the first side of the second region adjacent the second side of the first region, the first side of the third region adjacent the second side of the second region, and the first side of the fourth region adjacent the second side of the third region, and the at least first, second, third and fourth doped regions providing current paths, in a direction of the sequential arrangement, alternating between p-type and n-type regions; an anode arranged on the first side of the first region; a base terminal arranged on the first side of the second region, one of the first and second regions being a p-type region and the other of the first and second regions being an n-type region; a gate arranged on the first side of the third region for controlling an on/off state of the thyristor; a cathode arranged on the second side of the fourth region; and current dividing means for dividing a current, flowing from a load, between the anode and the base terminal, the current dividing means being connected at a first end to the anode and the base terminal, and having a second end for being connected, during operation, to the load, so that only a portion of the load current flows to the anode.

This device may be arranged such that the current entering the anode flows through an odd number of p/n or n/p junctions as it travels through the first, second, third and fourth doped regions, and the current entering the base terminal flows through an even number of p/n or n/p junctions as it travels through the first, second, third and fourth doped regions to either the cathode or anode.

In this device, the first region may be a p-type region, the second region an n-type region, the third region a p-type region, and the fourth region an n-type region. The current dividing means may comprise first and second resistors, the first resistor being connected at a first end to the anode, and the second resistor being connected at a first end to the base terminal, and the first and second resistors being adapted to be connected at respective second ends to a same point of the load so as to divide the load current. The first resistor may have a resistance greater than a resistance of the second resistor.

The second region may be more highly doped with n-type material than the third region is doped with p-type material, and the second region may be thicker than the third region.

The dopant concentration of the first region is approximately $1\times10^{19}$ cm$^{-3}$; the dopant concentration of the second region may range from about $1\times10^{17}$ cm$^{-3}$ to about $5\times10^{18}$ cm$^{-3}$; the dopant concentration of the third region may range from about $1\times10^{17}$ cm$^{-3}$ to about $2\times10^{19}$ cm$^{-3}$; and the dopant concentration of the fourth region may range from about $1\times10^{18}$ cm to about $5\times10^{18}$ cm$^{-3}$. An additional region arranged between said second and fourth regions may be provided, and the additional region has a concentration of less than about $5\times10^{15}$ cm$^{-3}$.

The device may further comprise a gate control means for providing pulses to the gate to turn the thyristor on and off. The gate control means may comprise a voltage source and a gate resistor connected between the voltage source and the gate. The device may further comprise a power source means for generating a load current for input to the anode and the base terminal via the current dividing means.

According to the present invention there is further provided a method of providing an improved Silicon Carbide (SiC) Gate Turn-Off (GTO) thyristor, comprising the steps of:

(a) providing a substrate formed of SiC having at least three epi-layers arranged thereon as first, second, third doped regions, and the substrate comprising a fourth doped region, wherein each of the first, second, third and fourth doped regions having a first side and a second side opposite to the first side, the first, second, third and fourth doped regions being disposed in a sequential arrangement to at least partially overlap one another to form a stack with the first side of the second region adjacent the second side of the first region, the first side of the third region adjacent the second side of the second region, and the first side of the fourth region adjacent the second side of the third region, and the at least first, second, third and fourth doped regions providing current paths, in a direction of the sequential arrangement, alternating between p-type and n-type regions;

(b) arranging an anode on the first side of the first region;

(c) arranging a base terminal on the first side of the second region;

(d) arranging a gate on the first side of the third region for controlling an on/off state of the thyristor;

(e) arranging a cathode on the second side of the fourth region; and (f) providing a current dividing circuit connected at a first end to the anode and the base terminal, and having a second end adapted for connection to a load, so that a total load current which flows to the. thyristor is divided between the anode and the base terminal.

The method may be such that the current entering the anode may flow through an odd number of p/n or n/p junctions of the first, second, third and fourth doped regions, and the current entering the base terminal may flow through an even number of p/n or n/p junctions as it travels through the first, second, third and fourth doped regions.

Step (a) may further comprise: doping the first region to form a p-type region; doping the second region to form an n-type region; doping the third region to form a p-type region; and doping the fourth region to form an n-type region. The second region may be doped so as to be more highly doped with n-type material than the doping of the third region is doped with p-type material; and the second region may be provided with a thickness which is greater than a thickness of the third region.

The dopant concentration provided to the first doped region may be greater than about $1\times10^{19}$ cm$^{-3}$. The dopant concentration of the second doped region may range from about $1\times10^{17}$ cm$^{-3}$ and about $5\times10^{18}$ cm$^{-3}$ and the concentration of the third doped region may range from about $1\times10^{17}$ cm$^{-3}$ to about $2\times10^{19}$ cm$^{-3,}$ and the concentration of the fourth doped region may range from about $1\times10^{18}$cm$^{-3}$ to about $5\times10^{19}$ cm$^{-3}$.

An additional region may be provided between the second and fourth regions having a concentration of less than about $5\times10^{15}$ cm$^{-3}$.

Step (f) may further comprise: dividing the current by providing first and second resistors connected at each of their respective first ends at a same point of a load, and connecting the first resistor at its second end to the anode, and connecting the second resistor at its second end to the base terminal. The first resistor may have a resistance which is greater than a resistance of the second resistor.

The method may further comprise providing pulses for controlling the gate to turn on and off the thyristor.

Step (g) may include providing a voltage source and a gate resistor connected between the voltage source and the gate.

DETAILED DESCRIPTION OF THE PREFERRED EMBODIMENTS

Figure 1:
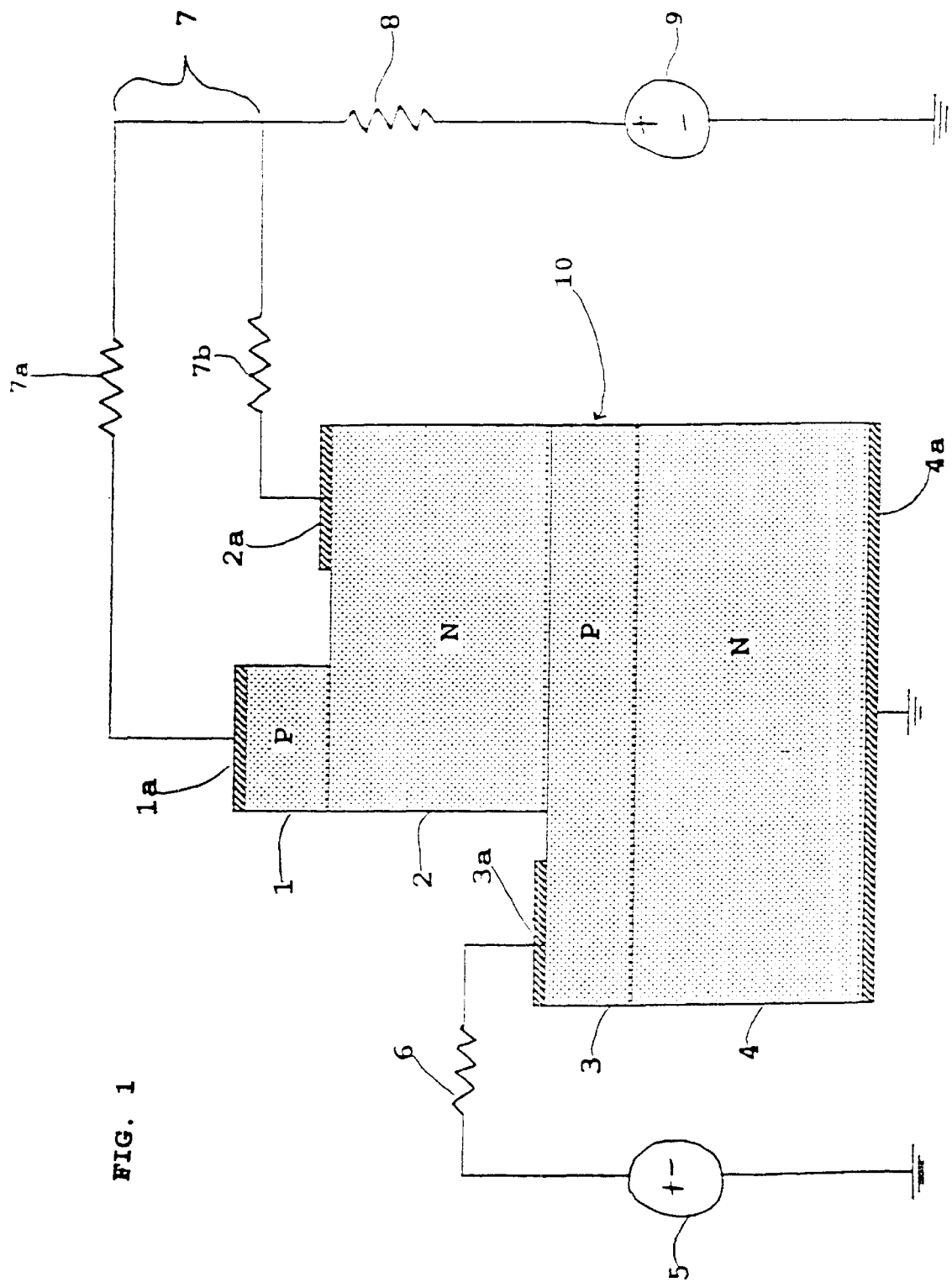
FIG. 1 shows a SiC GTO Thyristor according to the present invention.

FIG. 1 shows the structure of the SiC GTO thyristor according to the present invention. It will be understood by those of ordinary skill in the art that the thyristor shown in FIG. 1 represents one finger of a multi-finger structure, and the multi-finger structure may be formed by laterally connecting a plurality of thyristors together.

Thyristor 10 comprises a SiC structure including four doped regions 1, 2, 3, and 4, which are arranged on each other in succession so as to form, in this particular embodiment, a p/n/p/n structure in regions 1–4.

Regions 1–4 each have a metal deposited thereon for electrical contact. Anode 1a is arranged on region 1; and base terminal 2a is arranged on region 2. Gate 3a is arranged on region 3; and cathode 4a is arranged on cathode 4.

Region 1 is a highly doped p-type region, which is an epilayer. Region 2 is an n-type region, which is also an epilayer. Region 3 is a p-type region, which is yet another epilayer; and region 4 is an n-type region, which is the substrate. It will understood by those of ordinary skill in the art that "n-type" and "p-type" refer to the majority of charge carriers which are present in a respective region.

For example, in an n-type region, electrons are the majority carriers, and in a p-type region, holes (the absence of electrons) are the majority carriers. The p-type regions 1 and 3 may have their SiC crystals doped with, for example, aluminum impurities (acceptors), whereas the n-type regions 2 and 4, may be doped with, for example, nitrogen impurities (donors).

Voltage source 5 and resistor 6 comprise a gate control circuit and are connected to gate 3a.

In order to turn on the thyristor, the voltage source 5 provides a current pulse to gate 3a to increase the amount of forward bias that exists in the junction between regions 3 and 4. Conversely, the thyristor is turned off by the voltage source circuit 5 providing a current to the gate 3a which is reverse biased with respect to the p/n junction between regions 3 and 4.

Current dividing circuit 7 includes resistors 7a and 7b, wherein a first end of resistor 7a is connected to the anode 1a, and a first end of resistor 7b is connected to the base terminal 2a. Both resistors 7a and 7b are connected at their respective second ends at a same point to load 8.

The current dividing circuit functions such that a load current $I_L$, which has been generated by the application of a voltage from a second voltage source 9 to load 8, is divided between resistors 7a and 7b.

Accordingly, a portion of the load current $I_L$ passes to the anode 1a via resistor 7a, and the remainder of the load current $I_L$ passes to the base terminal 2a via resistor 7b.

The portion of the load current $I_L$ which passes to anode 1a passes through (i.e. "sees") a total of three p/n or n/p junctions (junctions at regions 1–2, 2–3, 3–4). However, the total built-in potential through this path is equivalent to one p/n junction because the potential voltage drop of a p/n junction which is followed by an n/p junction (e.g. regions 1–2, 2–3) cancel each other out when the device is on.

In addition, there is a significant increase in conductivity between regions 2 and 3 because of the thyristor effect (high carrier injection from regions 1 and 4). Thus, at very high currents, the voltage drop encountered by the portion of the current passing from anode 1a to cathode 4a is lower than that seen in typical bipolar transistors, or insulated bipolar transistors.

The remainder of the load current $I_L$, which passes to base terminal 2a via resistor 7b, passes through (i.e. "sees") a total of two p/n or n/p junctions (regions 2–3 and 3–4). Since the voltage drops of an n/p junction followed by a p/n junction cancel each other out, the potential drop is approximately zero volts.

Accordingly, the present invention advantageously allows a portion of the load current to undergo a much lower voltage drop than the typical built in 3V value for SiC GTO Thyristors. The reduced voltage drop by a portion of the load current passing from the base terminal 2a to the cathode 4a reduces the total power loss by the thyristor, providing for lower operating temperatures, permitting control at higher power and increasing performance over SiC GTO thyristors known in the prior art.

Figure 2A:
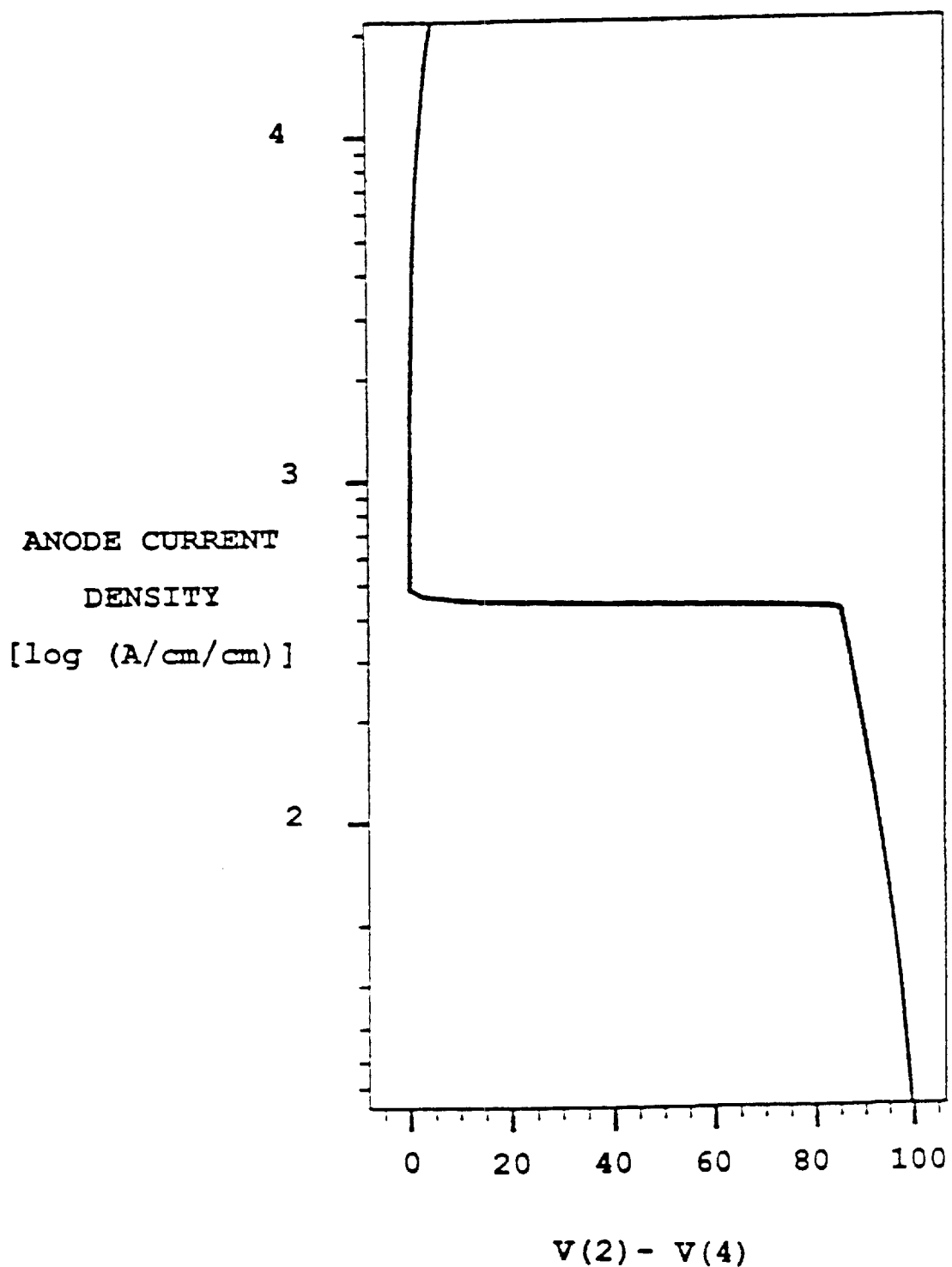
FIGS. 2A and 2B are graphical representations of the steady state current density vs. voltage plots of the thyristor according to the present invention.
Figure 2B:
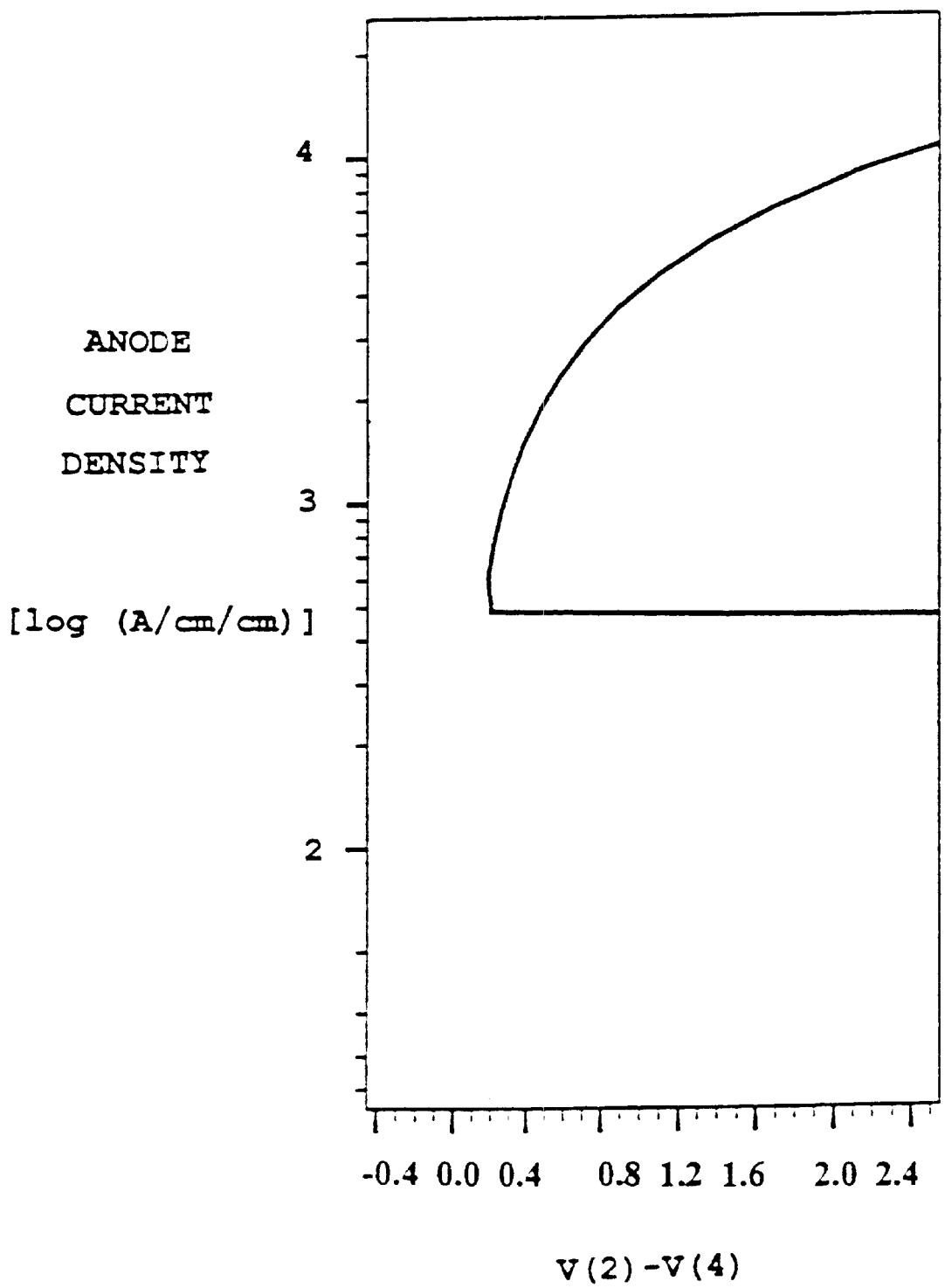

FIGS. 2a and 2b are respective graphical representations of the steady state anode current density (in logarithms) versus voltage plot of the thyristor shown in FIG. 1., for the voltage drop between the base terminal 2a to cathode 4a. FIG. 2b is an expanded view of the voltage axis shown in FIG. 2a.

FIGS. 2a and 2b were plotted assuming a total load current of 2250A/cm² passing through the load 8, with the values of the resistors 7a and 7b being predetermined so that a current of approximately of 1000A/cm² passes from anode 1a to cathode 4a, and 1250A/cm² passes from base terminal 2a to cathode 4a. Gate 3a receives a current equivalent to $-25A/cm^2$.

FIG. 2b shows that a current value of 1250 A/cm² that passes from base terminal 2a to cathode 4a encounters a voltage drop of only 0.4 V.

Figure 3:
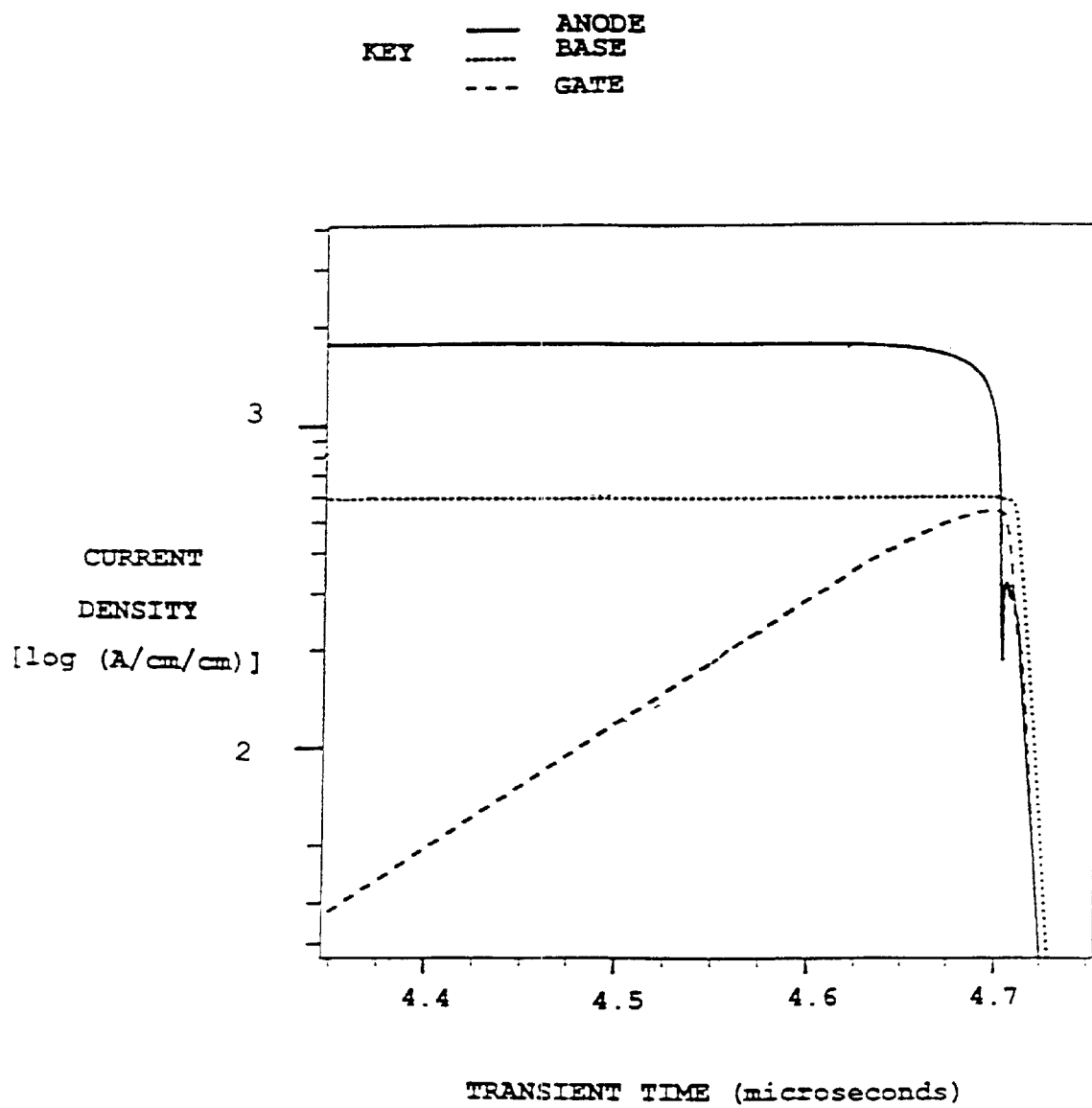
FIG. 3 is a graphical representation of transient switching characteristics of the thyristor according to the present invention.

FIG. 3 is a graphical representation of the transient switching characteristics demonstrating the switching off of the total current that enters the device at both anode 1a and base terminal 2a for different values of resistors 7a and 7b than those used for FIGS. 2a and 2b. The total current is equal to the amount at anode 1a (represented by the solid line) and the amount at the base 2a (represented by the dotted line).

As shown in FIG. 3, the current at gate 3a (represented by the dashed line) increases until the currents at anode 1a and base terminal 2a begin to decrease, as the thyristor switches off. The total time switching time is much faster than a typical switching time of prior art SiC GTO thyristors.

It is desirable to design the thyristor structure of the present invention to have a high turn-off gain. Turn-off gain is defined as the ratio of the cathode current to the maximum biasing gate current that turns off the thyristor.

In order to have a high turn-off gain, the electron injection efficiency at the junction between regions 3 and 4 should be high. Also, there should be very little recombination of the electrons injected into region 3 from region 4.

Furthermore, the hole injection from region 1 to region 2 should be low, and these injected holes should recombine greatly in region 2 so that very few of them reach region 3. Thus, for high turn-off gain, region 2 should be highly doped and thick, and region 3 should be lightly doped and thin.

It will be understood by those of ordinary skill in the art that acceptor concentration dopants have a lower ionization rate than donors, so that a lower concentration of donors gives the same effect as a high concentration of acceptors.

The above-disclosed conditions constitute the conditions for realizing a high turn-off gain and also reduce the possibility that the carrier extraction at the base terminal will cause the device to turn off due to the input current at the base terminal. This undesired turnoff is caused because the input current at the base terminal may reverse bias the p/n junction between regions 1 and 2. However, improving the turnoff gain for a reverse biasing gate current at gate 3a also reduces the effect of a reverse biasing current flowing between regions 1 and 2.

Additionally, for the particular embodiment disclosed above, the dopant concentrations of the regions are:

region 1: $N_A > 1 \times 10^{19}$ cm$^{-3}$;
region 2: $N_D = 1 \times 10^{17}$ cm$^{-3}$ to $5 \times 10^{18}$ cm$^{-3}$;
region 3: $N_A = 1 \times 10^{17}$ cm$^{-3}$ to $2 \times 10^{19}$ cm$^{-3}$; and
region 4: $N_D = 1 \times 10^{18}$ cm$^{-3}$ to $5 \times 10_{19}$ cm$^{-3}$.

In addition, in a five region SiC thyristor, an additional region, which is arranged between the second and fourth regions and serves as the drift region, and comprises a concentration of less than $5 \times 10^{15}$ cm$^{-3}$.

It will be understood by those of ordinary skill in the art that the dopant concentrations can be optimized for the specific application in which the SiC GTO thyristor is used.

Figure 4:
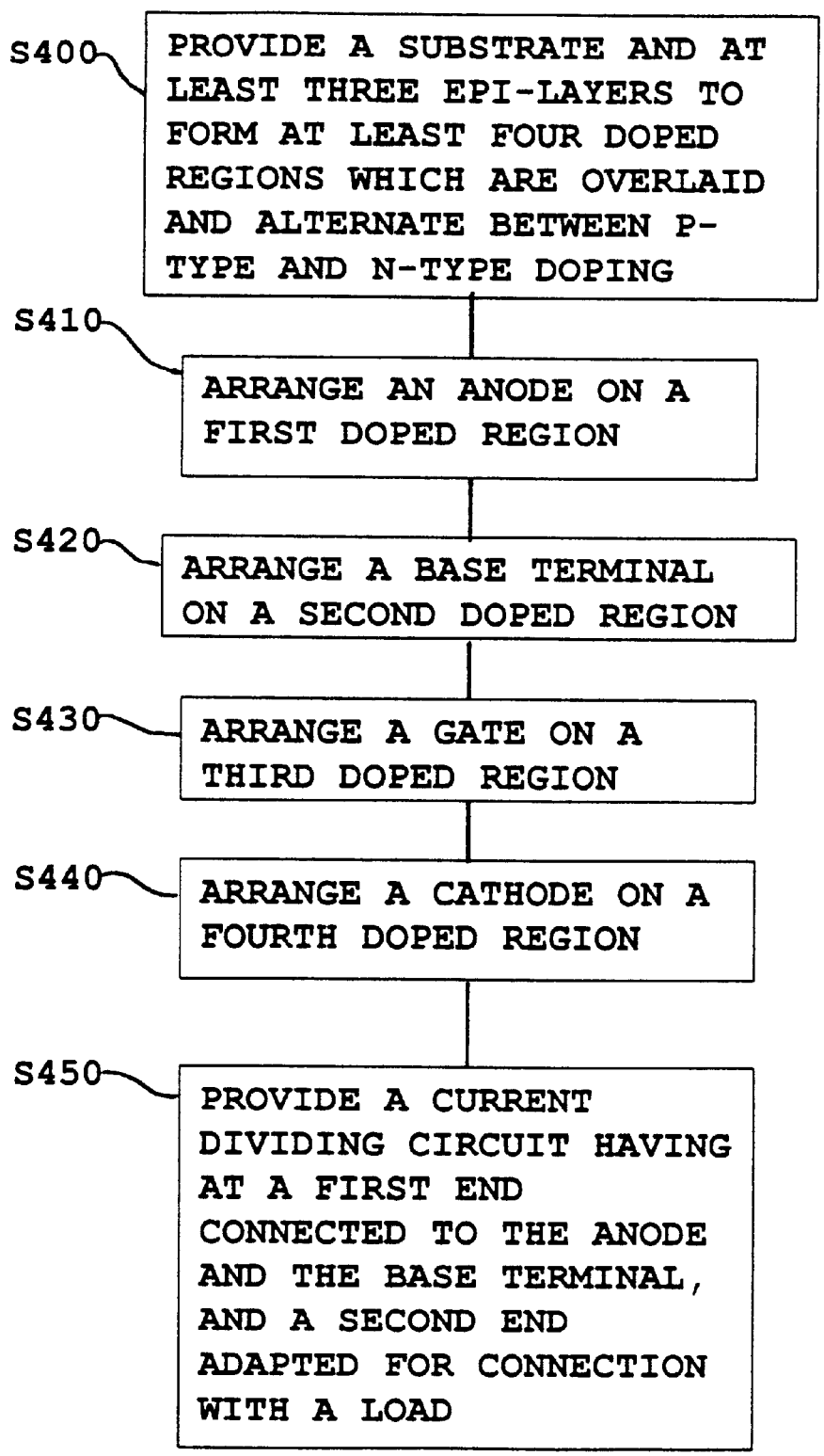
FIG. 4 provides a flowchart showing a method of manufacturing the SiC GTO Thyristor of the present invention.

FIG. 4 is a flowchart illustrating a method of manufacturing the SiC GTO thyristor of the present invention.

Step 400 includes providing a substrate having at least three epi-layers arranged thereon as first, second and third doped regions, respectively, and the substrate being a fourth doped regions. The regions are at least partially overlaid, wherein the doped regions alternate between p-type and n-type doping.

At step 410, an anode is arranged on a first doped region.

At step 420, a base terminal is arranged on a second doped region.

At step 430, a gate is arranged on a third doped region.

At step 440, a cathode is arranged on a fourth doped region.

At step 450, a current dividing circuit is provided which is connected at a first end to the anode and the base terminal. The second end of the current dividing circuit is adapted for connection to a load.

The current dividing circuit permits the total load current flowing to the SiC GTO thyristor to be divided in a first path from the anode to the cathode, and in a second path from the base to the cathode.

The above method may optionally include providing an odd number of p/n or n/p junctions of the doped regions for the portion of the load current which flows to the anode flows to the cathode, and the portion of load current which flows to the base terminal flows through an even number of p/n or n/p junctions of the doped regions to either the cathode or anode.

As disclosed above, the advantage of providing a portion of the load current to a base terminal with an odd number of regions is that this achieves a reduced voltage drop (and thus power dissipation) by the thyristor and permits higher current densities than the prior art devices.

Figure 5A:
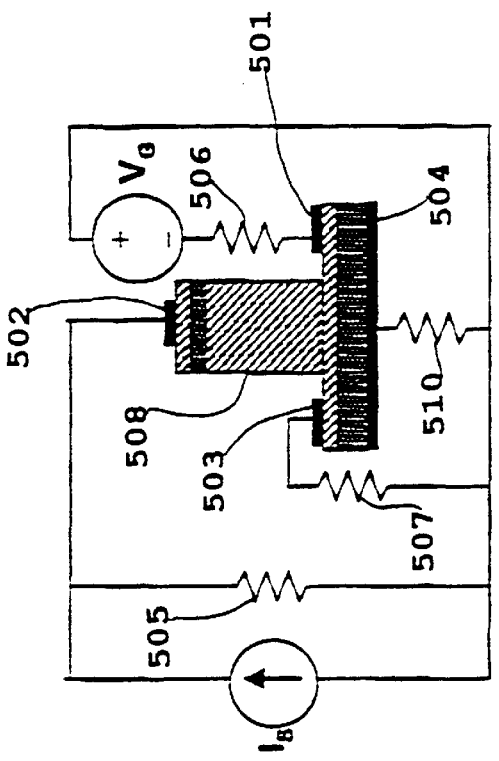
FIGS. 5A–5C show further embodiments of the SiC GTO Thyristor of the present invention.
Figure 5B:
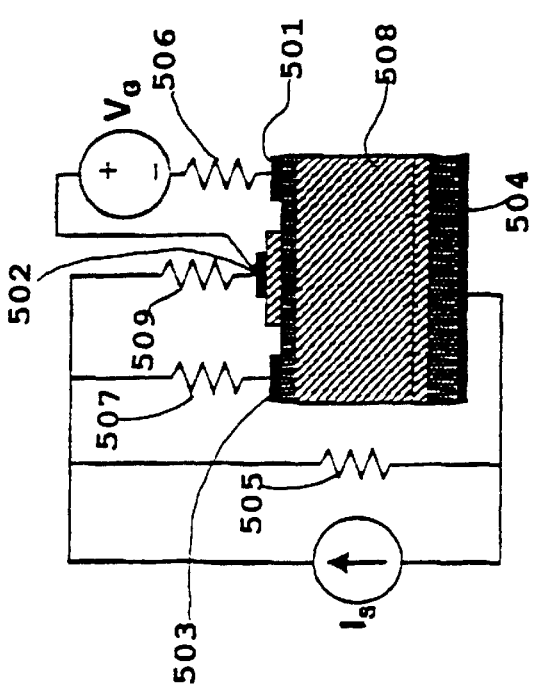
Figure 5C:
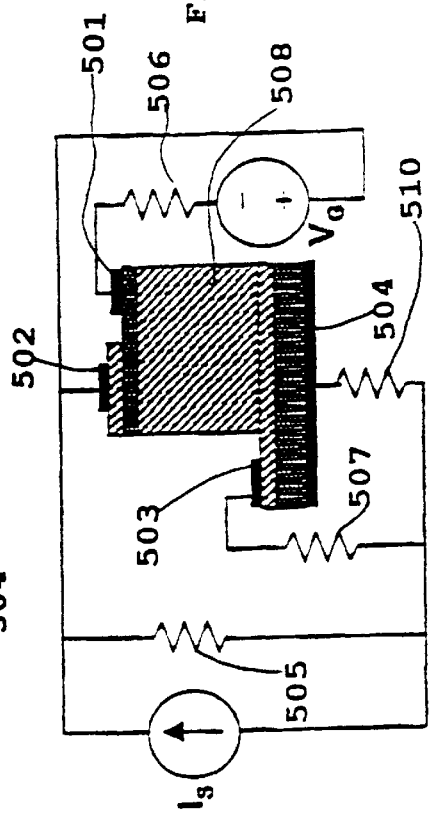

FIGS. 5A–5C illustrate some variations of the SiC GTO thyristor of the present invention. In the embodiments of FIGS. 5A–5C, the SiC GTO thyristor is asymmetrical in the sense that there are five layers (each layer is a doped region), rather than four layers (doped regions) as in the symmetrical four layer device illustrated in FIG. 1.

Each of the devices of FIGS. 5A–5C comprises a gate 501, anode 502, base 503, cathode 504, load resistor 505, gate resistor 506 and base resistor 507.

In the devices shown in FIGS. 5A–5C, the thickest center doped region 508 is doped at a concentration of $1 \times 10^{15}$ cm$^{-3}$. In FIGS. 5A–5C, the donor doped designation in the legend refers to the "N" regions, whereas the acceptor doped designation in the legend refers to the "P" regions.

As shown in FIG. 5A, the gate voltage "$N_G$" and gate resistor 506 are connected between the gate 501 and the anode 502. The total current controlled by the SiC GTO thyristor is split between the base resistor 507 and the anode resistor 509. Thus, the current flowing through the anode 502 to cathode 504 flows through three p/n or n/p junctions, while the current flowing through the base 503 to cathode 504 flows through two p/n or n/p junctions.

As shown in FIG. 5B, the gate 501 and base 503 are arranged on the same epi-layer, and are disposed laterally away from the main p/n/p/n region 508 (in which current flows through anode 502 to cathode 504). The current flowing through the anode 502 to base 503 flows through two p/n or n/p junctions.

Although the present invention has been fully described by way of examples with reference to the accompanying drawings, it should be understood that numerous variations, modifications and substitutions, as well as rearrangements and combinations, of the preceding embodiments will be apparent to those skilled in the art without departing from the spirit and scope of this invention and the appended claims.

For example, it is within the scope of the present invention to provide a thyristor with more than four doped regions, and the arrangements of the p-type and n-type regions (the first region being an n-type region, the second region a ptype region, etc.) can be varied from the arrangement disclosed in the above embodiments. In addition, the resistance of the current dividing circuit may be chosen to provide values required for a specific application of the thyristor, and any known current dividing circuit using components other than (or in addition to) resistors is also within the spirit of the invention and the scope of the appended claims. Moreover, resistor 7b may be the load resistor and resistor 8 may be the second resistor of the current dividing circuit. The dopant concentrations of the SiC regions, and the doping materials used to fabricate the p-type and n-type areas, can be varied according to the specific requirements of the application using the thyristor structure of the present invention.

What is claimed is:

1. A Silicon Carbide (SiC) Gate Turn-Off (GTO) thyristor structure comprising:

a substrate formed of SiC having at least three epi-layers arranged thereon as first, second and third planar doped regions, respectively, said substrate comprising a fourth doped region, and each of said first, second, third and fourth doped regions having a first side and a second side opposite to said first side, said first, second, third and fourth doped regions being disposed in a sequential arrangement to at least partially overlap one another to form a stack with said first side of said second region adjacent said second side of said first region, said first side of said third region adjacent said second side of said second region, and said first side of said fourth region adjacent said second side of said third region, and said at least first, second, third and fourth doped regions providing current paths, in a direction of said sequential arrangement, alternating between p-type and n-type regions;

an anode arranged on said first side of said first doped region;

a base terminal arranged on said first side of said second doped region, one of said first and second regions being a p-type region and the other of said first and second regions being an n-type region;

a gate arranged on said first side of said third doped region for controlling an on/off state of said thyristor;

a cathode arranged on said second side of said fourth doped region; and current dividing means for dividing a current, flowing from a load, between said anode and said base terminal, said current dividing means being connected at a first end to said anode and said base terminal, and having a second end for being connected, during operation, to the load, so that only a portion of the load current flows to said anode.

2. The device according to claim 1, wherein the current entering said anode flows through an odd number of p/n or n/p junctions as it flows through said first, second, third and fourth doped regions to said cathode, and the current entering the base terminal flows through an even number of p/n or n/p junctions as it travels through said first, second, third and fourth doped regions to either said cathode or said anode.

3. The device according to claim 1, wherein said first doped region is a p-type region; said second doped region is an n-type region; said third doped region is a p-type region; and said fourth doped region is an n-type region.

4. The device according to claim 1, wherein said current dividing means comprises first and second resistors, said first resistor is connected at a first end to said anode, and said second resistor is connected at a first end to said base terminal, and said first and second resistors are adapted to be connected at respective second ends to a same point of the load so as to divide the load current.

5. The device according to claim 1 further comprising a gate control means for providing pulses to said gate to turn said thyristor on and off.

6. The device according to claim 3, wherein said second doped region is more highly doped with n-type material than said third doped region is doped with p-type material; and said second doped region is thicker than said third doped region.

7. The device according to claim 3, wherein: a dopant concentration of said first region is about $1\times10^{19}$ cm$^{-3}$; a dopant concentration of said second region ranges from approximately $1\times10^{17}$ cm$^{-3}$; to $5\times10^{18}$ cm$^{-3}$, a dopant concentration of said third region ranges from approximately $1\times10^{17}$ cm$^{-3}$ to $2\times10^{19}$ cm$^{-3}$; and a dopant concentration of said fourth region ranges from approximately $1\times10^{18}$ cm$^{-3}$ to $5\times10^{19}$ cm$^{-3}$.

8. The device according to claim 1, further comprising an additional region arranged between said second and fourth regions having a dopant concentration of less than $5\times10^{15}$ cm$^{-3}$.

9. The device according. to claim 8, wherein said base and said gate are both arranged on one of said second doped region and said third doped region.

10. The device according to claim 5, wherein said gate control means comprises a voltage source and a gate resistor connected between said voltage source and said gate.

11. The device according to claim 1 further comprising a power source means for generating a load current for input to said anode and said base terminal via said current dividing means.

* * * * *